United States Patent [19]
Clement

[11] Patent Number: 5,574,769
[45] Date of Patent: Nov. 12, 1996

[54] INDUCTIVE AMPLIFIER HAVING AUTOMATIC GAIN CONTROL FOR BUTT SET

[75] Inventor: Douglas S. Clement, Phoenix, Ariz.

[73] Assignee: Progressive Electronics, Inc., Mesa, Ariz.

[21] Appl. No.: 556,179

[22] Filed: Nov. 9, 1995

[51] Int. Cl.$^6$ .......................... H04M 1/24; H04M 3/08; G01R 19/14; H01H 31/02

[52] U.S. Cl. ...................... 379/21; 379/1; 379/2; 379/22; 379/26; 379/27; 379/29; 324/133; 324/145; 324/538; 324/562; 324/555; 324/556

[58] Field of Search .......................... 379/1, 2, 21, 22, 379/26, 27, 29; 340/635, 657; 324/133, 165, 66, 67, 538, 555, 556, 542

[56] References Cited

U.S. PATENT DOCUMENTS

| | | | |
|---|---|---|---|
| 4,670,709 | 6/1987 | Iredale | 324/133 |
| 4,724,382 | 2/1988 | Schauerte | 324/556 |
| 4,779,052 | 10/1988 | Levy | 324/542 |
| 4,843,620 | 6/1989 | Hagedorn | 379/29 |
| 5,025,466 | 6/1991 | Hilligoss | 379/1 |
| 5,157,708 | 10/1992 | Garthwaite | 324/556 |
| 5,170,429 | 12/1992 | Stocklin | 379/21 |
| 5,193,108 | 3/1993 | Stocklin | 379/21 |
| 5,319,306 | 6/1994 | Schuyler | 324/133 |

OTHER PUBLICATIONS

One page, two–sided brochure by Chesilvale Electronics Ltd. Corp. of Plant City, Florida, bearing 1991 copyright notice, and entitled "New Testing Technology, PTS Pair Tracing System, A Faster, One Handed Tracking Method".

One page, two–sided brochure by Chesilvale Electronics Ltd. Corp. of Plant City, Florida, bearing Sep. 1991 printing date code, and entitled "PTS Pair Tracing System, Pocket–Size Pair Tracing".

Three–page technical specifications by Chesilvale Electronics Ltd. Corp. of Plant City, Florida, bearing 1991 copyright notice, and bearing designation "Section CE–82–100, Issue 1, Oct. 15, 1991, PTS—Pair Tracing System, Technical Practice".

Progressive Electronics, Inc. Catalog dated Jul. 1992.

Primary Examiner—Wellington Chin
Assistant Examiner—Vijay Shankar
Attorney, Agent, or Firm—Cahill, Sutton & Thomas, P.L.C.

[57] ABSTRACT

An inductive amplifier for identifying and tracing wires includes an automatic gain control feature for sensing the connection of butt set leads to the inductive amplifier and reducing the gain of the inductive amplifier in such instances to reduce the likelihood of instability or oscillations. The inductive amplifier includes a probe for sensing an input signal which is filtered and amplified for driving either an internal speaker or a speaker in the earpiece of an external butt set. The inductive amplifier includes circuitry for sensing that the leads of the butt set have been connected to the inductive amplifier, and for reducing the gain of the inductive amplifier by a factor of ten under such circumstances.

2 Claims, 7 Drawing Sheets

INDUCTIVE AMPLIFIER HAVING AUTOMATIC GAIN CONTROL FOR BUTT SET

BACKGROUND OF THE INVENTION

1. Field of the Invention

The present invention relates generally to inductive amplifiers used to identify and trace a particular wire within a group of wires, and more particularly, to an inductive amplifier having an automatic gain control for reducing the gain of the inductive amplifier whenever an external butt set is coupled to the inductive amplifier.

2. Description of the Relevant Art

Inductive amplifiers, or tone detectors, are high impedance amplifiers used by telecommunications service personnel to identify and trace a particular pair of wires within a group or bundle of wires, without damaging the insulation surrounding each of such wires. Such inductive amplifiers are commonly used in conjunction with tone generators for tracing wires. The tone generator is coupled with a particular pair of wires of interest to inject a distinctive audio frequency tone within such wires. Typical audio tone generators are capable of providing two different tones within two different frequency ranges. A first, or lower, tone is provided within the frequency range of 500 Hz. to 1100 Hz. A second, or higher, tone is provided within the frequency range of 800 Hz. to 1600 Hz. The output of the tone generator can provide one of such tones continuously, or can be caused to rapidly switch between the lower and higher tones to produce a warbled output tone. Accordingly, most inductive amplifiers are designed to be responsive to frequencies within the range of approximately 300 Hz. to 3,000 Hz.

During use, the probe tip of the inductive amplifier is placed adjacent one of several wires to identify the particular pair of wires conducting the injected audio tone. The inductive amplifier typically includes a built-in loudspeaker which can be used to produce an audible signal derived from the injected audio tone. In addition, terminals may be provided for allowing a rugged service telephone handset, or buttset, to be attached to the inductive amplifier to reproduce the detected audible tone in the earphone of the buttset.

When a user of an inductive amplifier is not using a butt set therewith, the internal speaker of the inductive amplifier must be driven with a relatively high volume output signal so that the tone emitted by the internal speaker can be heard over background sounds when the inductive amplifier is held at arm's length. However, when using a butt set, a service technician usually holds the earpiece of the butt set adjacent the user's ear. Unless the volume knob of the inductive amplifier is adjusted, the volume of the sounds produced in the earpiece of the butt set is likely to be too high and irritating.

In addition, the connection leads of a typical butt set are approximately six feet long and are unshielded. Accordingly, the attachment of butt set leads can serve to introduce noise, feedback, or other stray signals into the inductive amplifier circuitry, particularly when the gain of the inductive amplifier is set to a high level; these signals can cause instability and oscillations within the inductive amplifier, making it more difficult or impossible for the user to discern the desired signal tone output by the tone generator.

Accordingly, it is an object of the present invention to provide an inductive amplifier which includes both a built in speaker and butt set terminals to facilitate the connection of the leads of a butt set, and which automatically reduces the gain of the output signal when a butt set is connected to the inductive amplifier.

It is another object of the present invention to provide such an inductive amplifier which lessens the likelihood of instability and/or oscillations within the inductive amplifier when a butt set is connected thereto.

It is still another object of the present invention to provide such an inductive amplifier which can be manufactured easily and inexpensively.

These and other objects of the present invention will become more apparent to those skilled in the art as the description of the present invention proceeds.

SUMMARY OF THE INVENTION

Briefly described, and in accordance with a preferred embodiment thereof, the present invention provides an inductive amplifier apparatus for detecting and amplifying an electrical tone conducted by one of a group of wires in order to identify and trace a particular wire, wherein the inductive amplifier includes a housing for containing the components thereof, as well as an electrically conductive probe extending from the housing for being placed adjacent a wire under test to detect an electrical tone signal in the wire under test. The inductive amplifier also includes a variable gain amplifier contained within the housing to amplify the detected electrical tone signal. The variable gain amplifier selectively provides a first level of gain or a lower second level of gain.

A built-in speaker is provided within the housing for reproducing the amplified electrical tone as an audible signal. In addition, butt set terminals extend from, or are otherwise accessible from, the housing and are adapted to be coupled with leads of a telecommunications butt set for allowing a speaker within an earpiece of the telecommunications butt set to reproduce the amplified electrical tone as an audible signal.

The inductive amplifier also includes a butt set lead detection circuit for detecting that the leads of the butt set are connected to the butt set terminals; the butt set lead detection circuit causes the gain of the variable gain amplifier to decrease from the first level of gain to the second lower level of gain when the leads of the butt set are connected to the butt set terminals.

In the preferred embodiment of the invention, the variable gain amplifier includes an operational amplifier having a non-inverting input terminal, an inverting input terminal, and an output terminal. A feedback resistor is coupled between the output terminal and the inverting input terminal, and a gain control resistor has a first end coupled to the inverting input terminal of the operational-amplifier. An electronic switch is responsive to the butt set lead detection circuit, and is coupled between a second end of the gain control resistor and a d.c. bias potential. The electronic switch selectively couples the second end of the gain control resistor to the d.c. bias potential when the butt set leads are not connected to the butt set terminals for allowing the variable gain amplifier to provide the first level of gain; on the other hand, the electronic switch selectively uncouples the second end of the gain control resistor from the d.c. bias potential when the butt set leads are connected to the butt set terminals for causing the gain of the variable gain amplifier to decrease to the second lower level of gain.

DETAILED DESCRIPTION OF THE PREFERRED EMBODIMENT

Figures 1, 2:
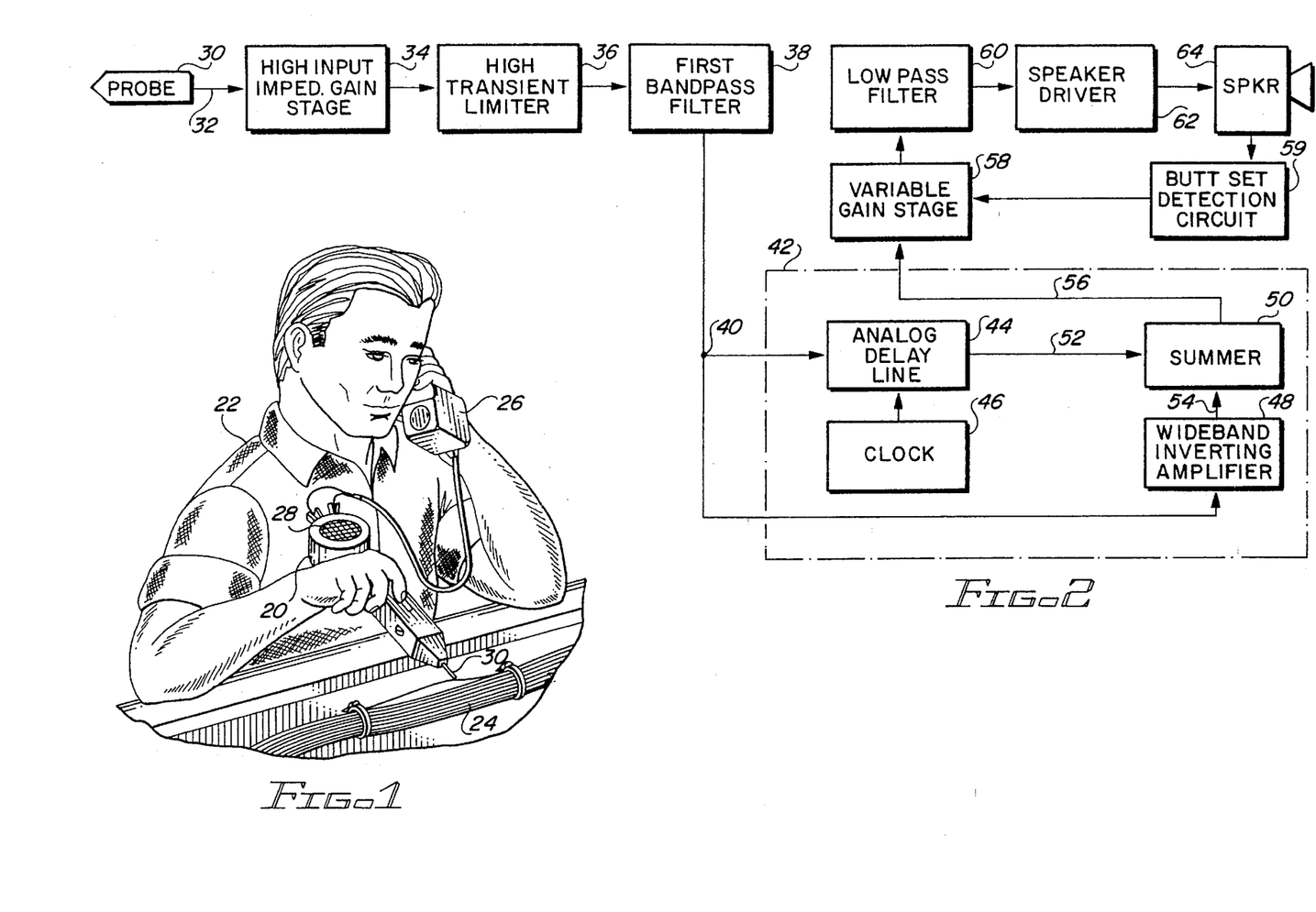
FIG. 1 is a perspective view of an inductive amplifier electrically coupled with a telecommunications set for detecting an audio tone injected into one of several wires.
FIG. 2 is a block diagram of the electronic components used in such inductive amplifier, including components for providing a comb filter.

Within FIG. 1, an inductive amplifier of the type designed to incorporate the present invention is designated generally by reference numeral 20 and is held by a user 22 adjacent one of a group of wires 24. Inductive amplifier 20 includes a housing that may be conveniently formed of molded plastic. An electrically conductive probe 30 projects from one end of inductive amplifier 20 for being placed adjacent a wire under test; probe tip 30 may be formed of a conductive plastic to avoid direct shorts of telephone equipment as might cause a failure in a home office. Inductive amplifier 20 includes an electronic amplifier having an input terminal coupled to conductive probe 30 for receiving an input signal therefrom and for generating an amplified output signal; the structure and manner of operation of such amplifier are described in greater detail below. A battery is also disposed within the molded plastic housing of inductive amplifier 20 for supplying electrical power to thereto.

When using inductive amplifier 20, an electrical tone generator (not shown) is coupled to an end of one of the wires within group 24 to inject therein an audio frequency signal. Such a tone generator may be of the type commercially available from Progressive Electronics, Inc. of Mesa, Ariz., under Model Nos. 77HP, 77M, or 77A. Such tone generator is capable of providing two different tones within two different frequency ranges. A first, or lower, tone is provided within the frequency range of 500 Hz. to 1100 Hz. A second, or higher, tone is provided within the frequency range of 800 Hz. to 1600 Hz. The output of the Model 77HP, 77M, and 77A tone generators can provide one of such tones continuously, or can be caused to rapidly switch between the lower and higher tones to produce a warbled output tone.

Inductive amplifier 20 is used for identifying and tracing the particular wire within group 24 into which the aforementioned audio signal has been injected. Inductive amplifier 20 detects and amplifies the electrical tone conducted by the particular wire to which the tone generator has been coupled, and generates an audible tone signal indicating the presence of such injected signal to user 22.

As indicated within FIG. 1, user 22 may connect the terminals of a telecommunication handset, or butt set 26, to inductive amplifier 20 to listen for the audible tone in the earpiece of butt set 26; butt set 26 may be, for example, of the type known as a TS-22 Harris Dracon Hand Set. Alternately, user 22 may forgo the use of a butt set, and simply listen for a tone emitted by a built-in loudspeaker 28 disposed within inductive amplifier 20 opposite probe tip 30. The built-in loudspeaker 28 can be activated by user 22 depressing a manual switch in the form of a spring-biased pushbutton provided on the outer housing of inductive amplifier 20. Alternatively, inductive amplifier 20 can be automatically activated upon connection of butt set 26 to the butt set terminals of inductive amplifier 20, in the manner described in U.S. Pat. No. 5,457,441 issued to Clement, and assigned to the assignee of the present invention.

The block diagram of FIG. 2 shows the major circuit portions of inductive amplifier 20 incorporating a comb filter to suppress noise signals having a predetermined fundamental noise frequency, and to suppress noise signals having frequencies that are harmonics of said predetermined fundamental noise frequency, in accordance with a preferred embodiment of the present invention. As explained above relative to FIG. 1, probe 30 is an electrically conductive probe for being placed adjacent a wire under test and is coupled to a first input terminal 32 of a high input impedance gain stage 34 for receiving an input signal therefrom, and for amplifying audio signals received by probe 30. The output of high input impedance gain stage 34 is coupled to a high transient limiter stage 36 which blocks high amplitude transient signals from passing therethrough.

The output of high transient limiter stage 36 is coupled to the input of a bandpass filter stage 38. Bandpass filter 38 has an output terminal coupled to node 40; node 40 may be considered the input terminal of a comb filter to be described in greater detail below. Thus, high input impedance gain stage 34, high transient limiter stage 36, and bandpass filter stage 38 collectively couple electrically conductive probe 30 to the input terminal (node 40) of the comb filter. Bandpass filter 38 serves to limit the frequencies of signals provided to node 40 to a preselected range of frequencies, such as signals having frequencies between 500 Hz. and 3,000 Hz., since signals outside such range would not originate with the tone generator used to induce the tracing signal in the first place, and would be extraneous noise.

Still referring to FIG. 2, input node 40 is coupled to the input of a comb filter enclosed by dashed lines 42. Comb filter 42 includes an analog delay line 44, a clock 46, a wideband inverting amplifier 48, and a summer 50. The analog delay line 44 serves to recreate the analog voltage on input node 40 at output terminal 52, but the output analog voltage at output terminal 52 is time-delayed relative to the input analog voltage at node 40 by a delay time controlled by clock 46. In one preferred embodiment, clock 46 provides a clock signal to analog delay line 44 which causes analog delay line 44 to delay the output analog signal at terminal 52 relative to the input analog signal on node 40 by 16.67 msec., corresponding to the period for a 60 Hz. signal. Such a delay would preferably be used in areas like the United States where alternating current power lines provide electrical power at 60 Hz. On the other hand, when used in European countries, for example, the time delay would preferably be changed to 20 msec., corresponding to the period for a 50 Hz. signal. Thus, the analog delay line 44 serves to delay its output signal by a delay period substantially equal to the inverse of the predetermined fundamental noise frequency. The delayed output signal provided at output terminal 52 is coupled to a first input of summing circuit 50.

As shown in FIG. 2, input node 40 is also coupled to the input terminal of wideband inverting amplifier 48. Inverting amplifier 48 includes an output terminal 54 which provides a non-delayed output signal that is inverted in phase relative to the input analog signal at input node 40. Thus, if the input analog signal at node 40 is increasing in voltage, the inverted analog output signal provided at output terminal 54 will be decreasing in voltage. Output terminal 54 of inverting amplifier 48 is coupled to a second input terminal of summing circuit 50.

Summing circuit 50 serves to add together the delayed output signal at output terminal 52 and the inverted output signal at output terminal 54, and provides a summed output signal at output terminal 56. In a manner described in greater detail below relative to FIGS. 3, 4 and 5, summing circuit 50 provides the summed output signal at terminal 56 which minimizes or eliminates the fundamental frequency, as well as any harmonics of such fundamental frequency. Thus, assuming that the fundamental frequency is 60 Hz., then the summed output signal at output terminal 56 will attenuate any 60 Hz. components, as well as any 120 Hz. components, any 180 Hz. components, etc., thereby providing a noiseless output signal.

Output terminal 56 is coupled to the input of a variable gain stage 58 which amplifies the noiseless summed output signal. The gain of variable gain stage 58 is controlled by butt set detection circuit 59, which detects whether the leads of an external butt set are coupled to the inductive amplifier; if so, the gain is reduced to lessen the likelihood of instability. The output of gain stage 58 is coupled to the input of a low pass filter 60 which allows signals having a frequency below 5,000 Hz. to pass therethrough, but which attenuates any signals having a frequency above 5,000 Hz. The output of low pass filter 60 is coupled to the input of a speaker driver amplifier 62 for driving speaker 64. Once again, speaker 64 may correspond with either built-in speaker 28 (see FIG. 1) or the speaker contained within the earpiece of external butt set 26 (see FIG. 1).

Figure 3:
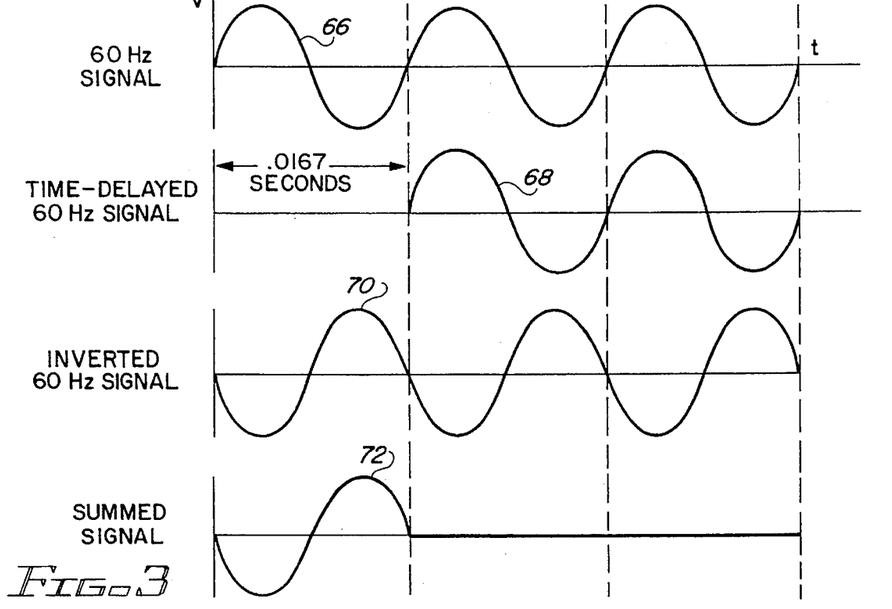
FIG. 3 is a waveform diagram illustrating how the components shown in FIG. 2 serve to filter out 60 Hz. signals from the output of the inductive amplifier.

The manner in which the circuitry shown in FIG. 2 functions to attenuate the fundamental noise frequency (e.g., 60 Hz.) and harmonics thereof will now be explained with reference to FIGS. 3–7. In FIG. 3, a 60 Hz. noise signal is represented by the uppermost waveform 66. The horizontal axis represents time, and the vertical axis represents voltage. Thus, waveform 66 is what a technician might observe in a noisy environment at input node 40 (see FIG. 2) on an oscilloscope screen. Each cycle period of the waveform 66 corresponds to 16.67 milliseconds. The second waveform shown in FIG. 3 represents the time-delayed output signal 68 produced by analog delay line 44 at output terminal 52 (see FIG. 2). It will be noted that, within the second waveform 68, no time-delayed output signal is shown for the first 16.67 msec. because the input signal is delayed by such amount. Thereafter, the time-delayed signal 68 is in phase with the signal 66 at input node 40. The third waveform 70 represents the inverted non-time-delayed output signal produced by inverting amplifier 48 at output terminal 54. Waveform 70 is 180 degrees out of phase with the input signal 66 at input node 40. Waveform 70 has the same amplitude as time-delayed waveform 68, but is 180 degrees out of phase therewith. Finally, the fourth waveform 72 in FIG. 3 represents the summed noiseless output signal provided at output terminal 56 of summing circuit 50. During the first 16.67 msec., the summed signal 72 is equal to the inverted signal 70; thereafter, the summed signal 72 is essentially zero, since the time-delayed signal and inverted signal tend to cancel each other out.

Figure 4:
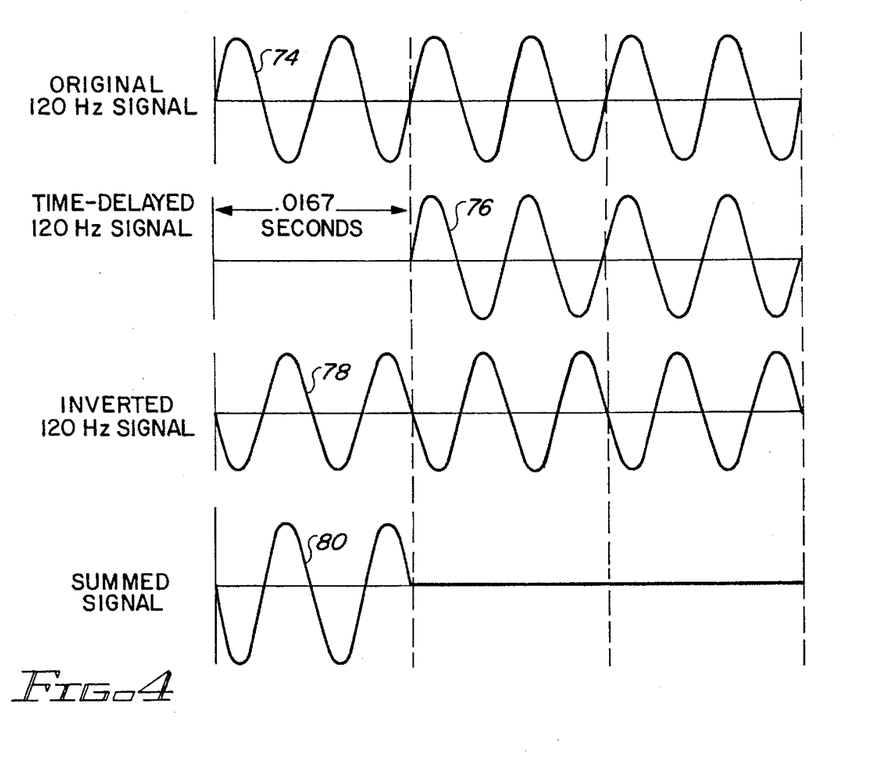
FIG. 4 is a waveform diagram illustrating how the components shown in FIG. 2 serve to filter out 120 Hz. signals from the output of the inductive amplifier.

FIG. 4 is similar to FIG. 3 but shows a harmonic noise component having a 120 Hz. frequency as the first waveform 74 at input node 40. As in FIG. 3, the second waveform 76 represents the time-delayed signal provided by analog delay line 44; once again, the time-delayed signal is in phase with the original input signal 74. The third waveform 78 again shows the inverted output signal provided by inverting amplifier 48; once again, waveform 78 is 180 degrees out of phase relative to input signal 74. Finally, the fourth waveform 80 represents the summed output signal provided by output terminal 56 of summing circuit 50; note that after the initial 16.67 msec. period, the summed output waveform 80 does not include the noisy harmonic 120 Hz. component.

Figure 5:
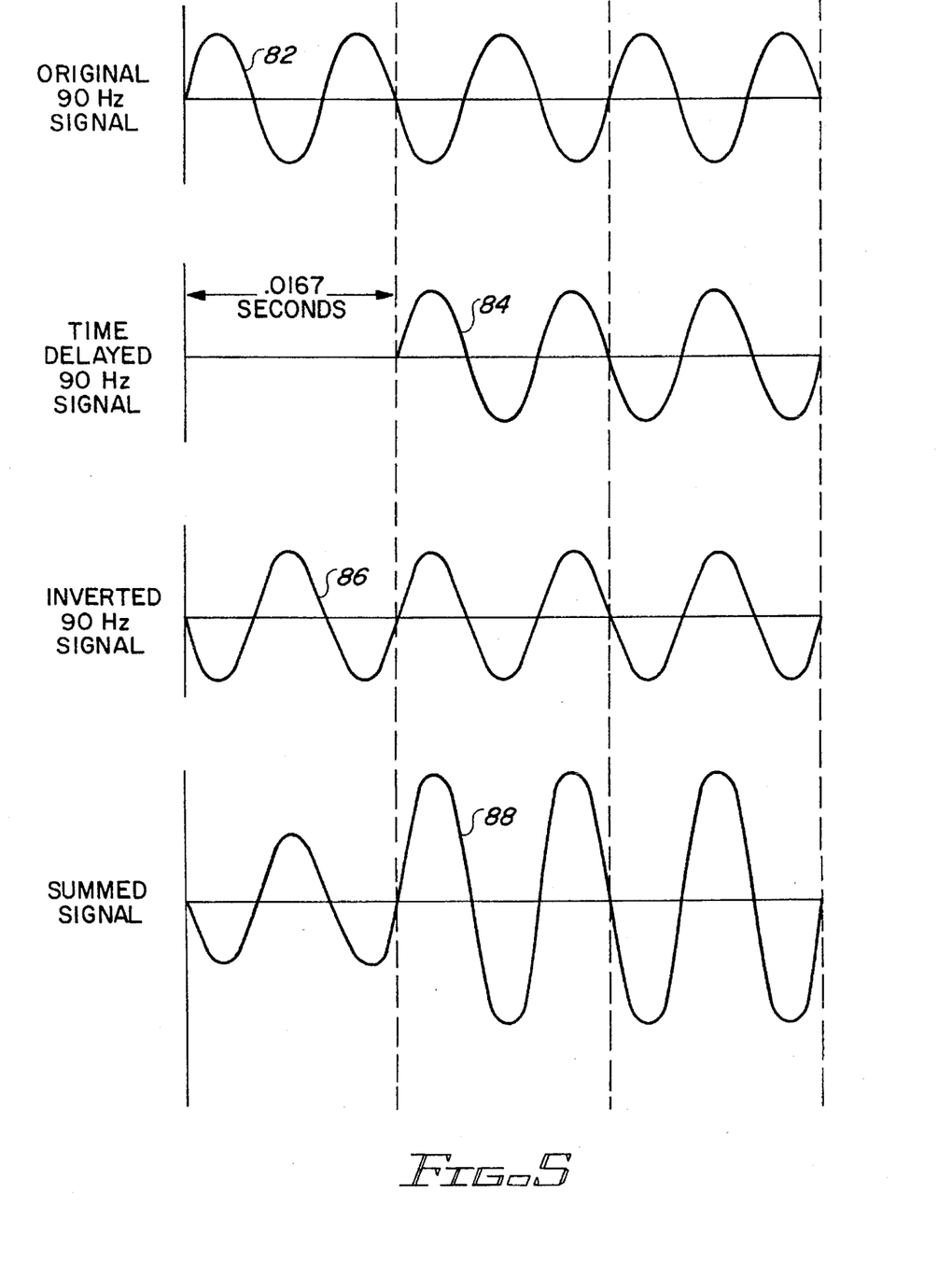
FIG. 5 is a waveform diagram illustrating how the components shown in FIG. 2 serve to pass a 90 Hz. signal to the output of the inductive amplifier.

FIG. 5 illustrates that signals of a frequency different from the fundamental noise frequency (and different from harmonics thereof) are allowed to pass through the comb filter 42. In FIG. 5, waveform 82 represents a 90 Hz. signal component at input node 40. Waveform 82 has a cycle period of 11.11 msec.; thus, each delay period of 16.67 msec. corresponds to one and one-half cycle periods of the 90 Hz. signal component. Accordingly, time-delayed waveform 84 is 180 degrees out of phase relative to input waveform 82. However, inverted signal waveform 86 is also 180 degrees out of phase relative to input waveform 82. Therefore, the summed output waveform 88 provided by output terminal 56 of summer 50, in the example shown in FIG. 5, is twice the amplitude of the original 90 Hz. input signal, and 180 degrees out of phase with respect thereto. Thus, the 90 Hz. signal is passed by, and, in the illustrated example, actually amplified by, comb filter 42. A passive summer circuit 50 could also be used, in which case the amplitude of the output signal would equal the amplitude of the input signal, with no amplification effect.

Figure 6:
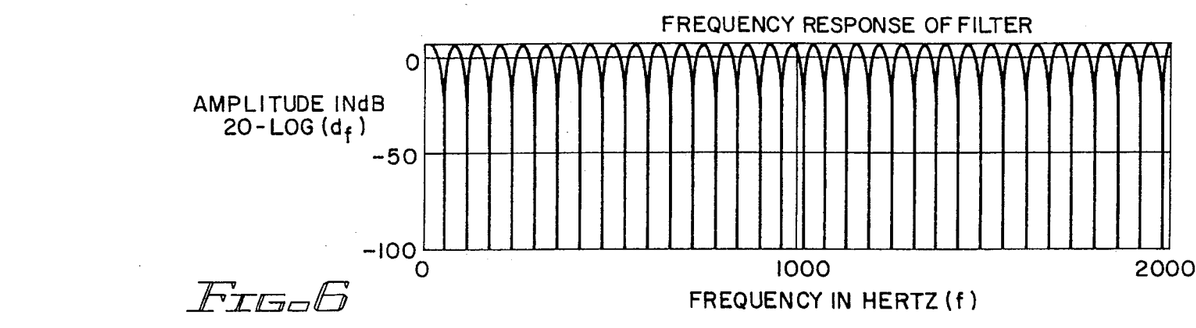
FIG. 6 is a waveform diagram illustrating the frequency response of the comb filter shown in FIG. 2.
Figure 7:
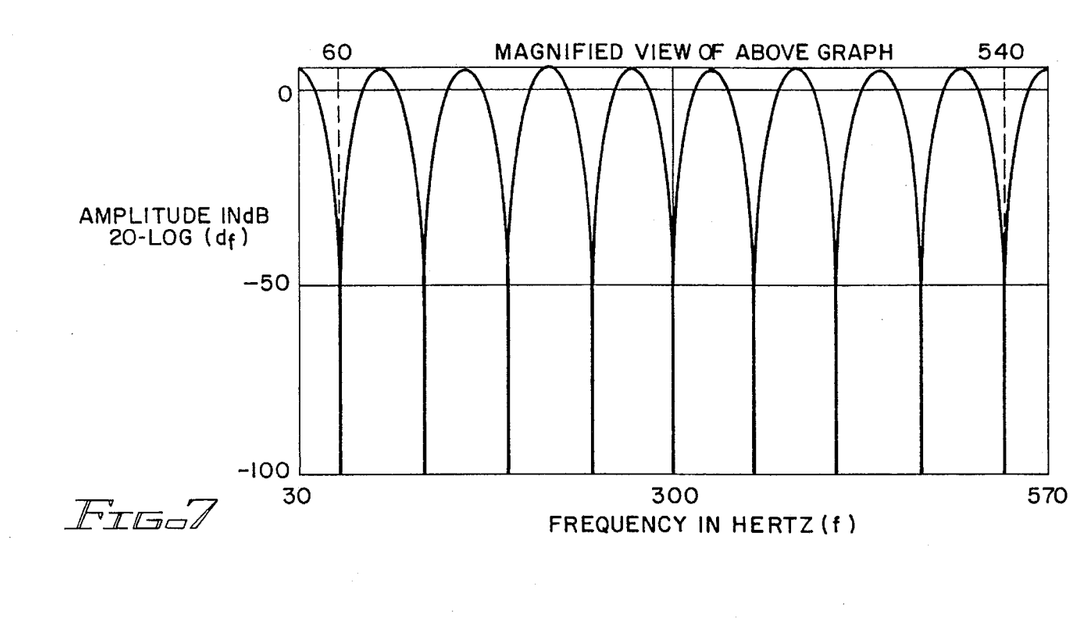
FIG. 7 is a magnified view of the portion of FIG. 6 for frequencies spanning 30 Hz. to 570 Hz.

FIG. 6 shows the overall frequency response of comb filter 42, assuming that the fundamental noise frequency is 60 Hz. The horizontal axis of FIG. 6 represents frequency, ranging from zero to 2,000 Hz.; the vertical axis represents the amplitude of the filtered output signal in decibels. FIG. 7 is an enlarged view of the portion of FIG. 6 ranging between 30 Hz. and 570 Hz. Those skilled in the art will appreciate that there are null points indicated at 60 Hz., 120 Hz., 180 Hz., 240 Hz., 300 Hz., 360 Hz., 420 Hz., 480 Hz., and 540 Hz., wherein the gain is −100 decibels. Thus, noise signals having a frequency of 60 Hz., or a harmonic thereof, are greatly attenuated by comb filter 42; signals having a frequency located midway between two null points are not attenuated at all; signals having a frequency near, but not equal to, 60 Hz. or a harmonic thereof, are attenuated to some degree.

Figure 8A:
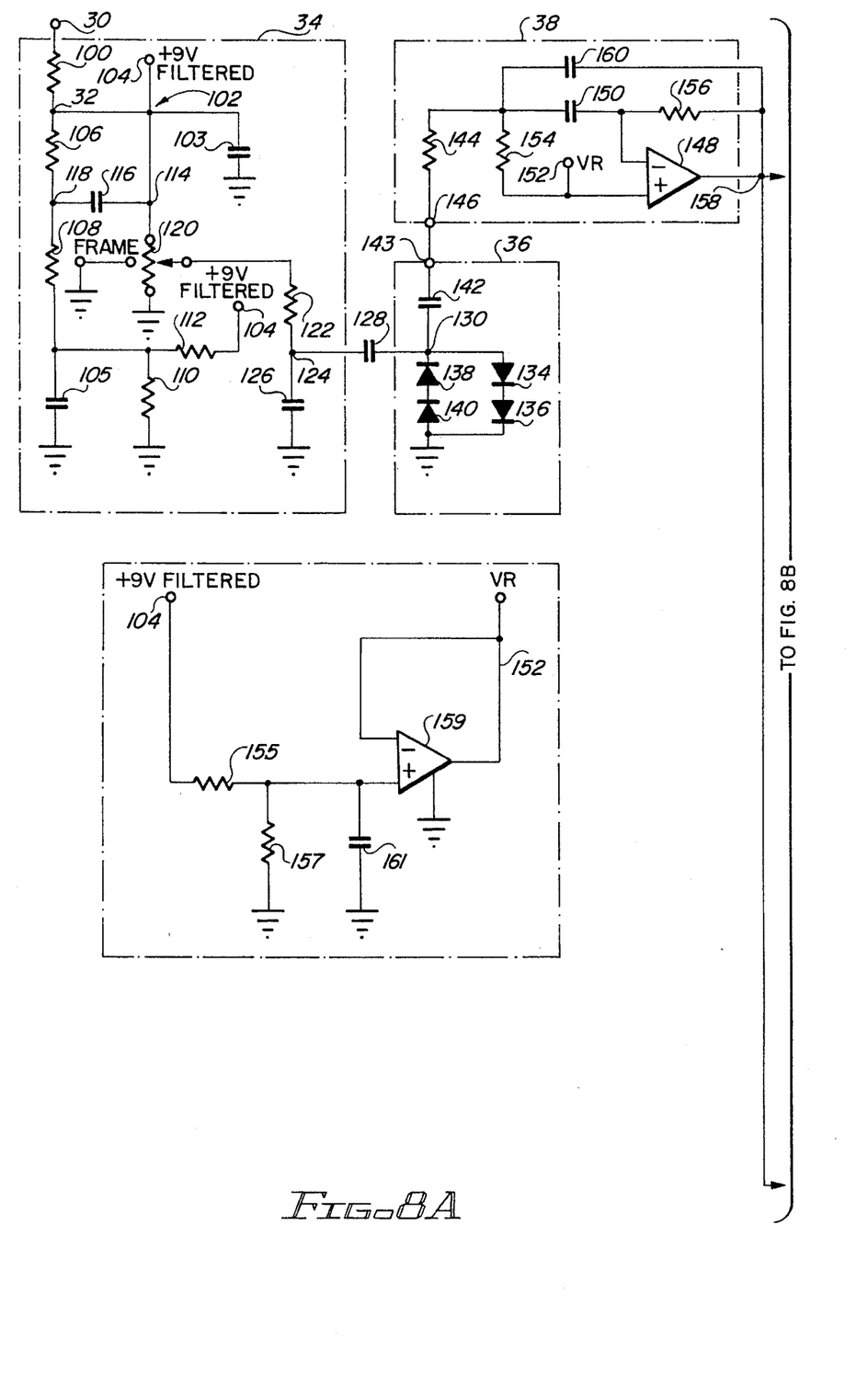
FIGS. 8A, 8B, 8C together form a detailed circuit schematic of the preferred embodiment of the invention shown in the block diagram of FIG. 2.
Figure 8B:
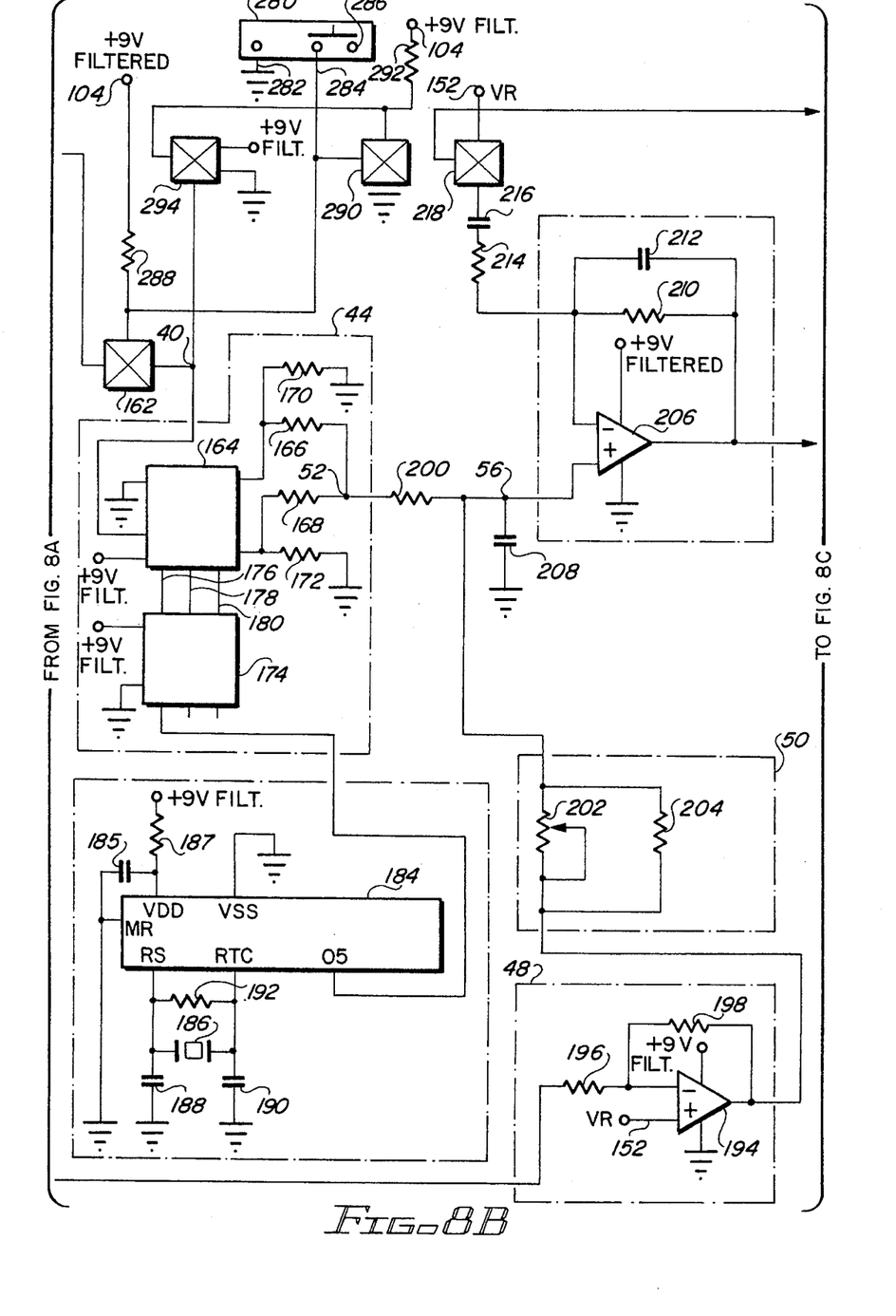
Figure 8C:
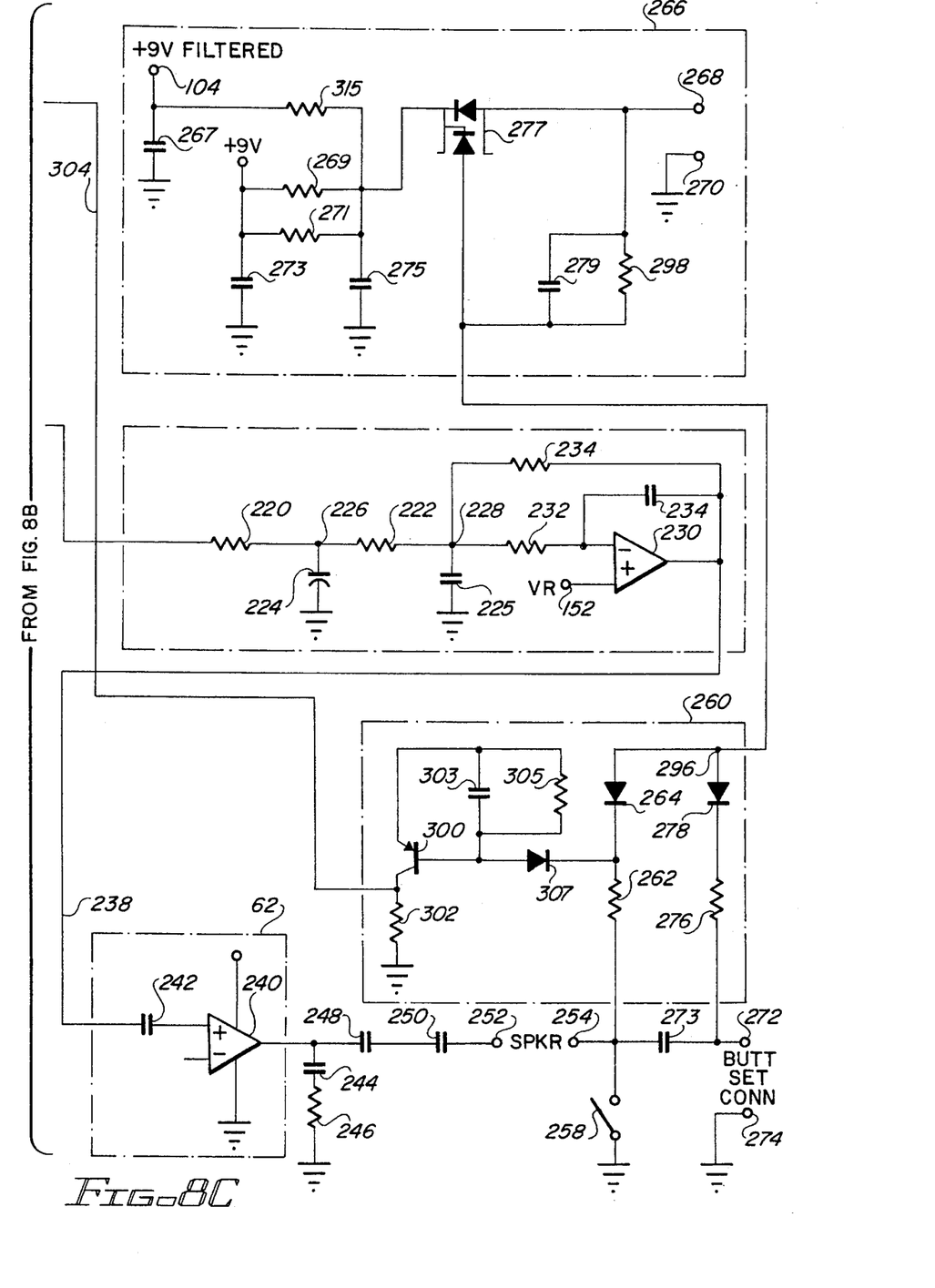

FIGS. 8A–8C set forth a detailed schematic drawing of the circuitry used to implement the circuit blocks shown in the block diagram of FIG. 2. In FIG. 8A, dashed block 34 corresponds to the high input impedance gain stage 34 shown in FIG. 2. Probe 30 is coupled through resistor 100 to input node 32. Input node 32 is connected to the gate of a field effect transistor 102, the drain terminal of which is coupled to a filtered source 104 of +9 volts. A biasing network including resistors 106, 108, 110, and 112 maintains a d.c. bias level at the gate of FET 102. The source terminal of FET 102 is connected to node 114. A feedback capacitor 116 extends between node 114 and input bias node 118 for the purpose of increasing the input impedance of the unit. A tapped resistor 120 extends between node 114 and ground. The center tap of tapped resistor 120 is connected through resistor 122 to node 124. Capacitor 126 extends between node 124 and ground.

Node 124 is coupled through capacitor 128 to the input node 130 of dashed block 36, corresponding to the high transient limiter shown in FIG. 2. Input node 130 is coupled through a first pair of series connected Schottky diodes 134 and 136 to ground. Thus, if node 130 rises more than two Schottky diode forward-biased voltages (approximately 0.7 volts) above ground, diodes 134 and 136 turn on and clip any positive transient voltages appearing at node 130. Likewise, should node 130 fall more than two Schottky diode forward-biased voltages (approximately 0.7 volts) below ground, diodes 138 and 140 turn on and clip any negative transient voltages appearing at node 130. Node 130 is further coupled by capacitor 142 to node 143 corresponding to the output of high transient limiter 36. Node 143 is in turn coupled by resistor 144 to node 146 of dashed block 38, which corresponds to the bandpass filter shown in FIG. 2.

Within FIGS. 8A, 8B, and 8C, reference is frequently made to a regulated voltage supply VR 152 which is closely regulated to approximately +4.5 volts. The circuitry used to derive such regulated voltage supply VR is shown in dashed block 153 of FIG. 8A. Resistors 155 and 157 are of equal value and form a voltage divider for halving the value of the +9 volt filtered voltage supply 104. Capacitor 161 filters the +4.5 volt level established at the non-inverting input terminal of op amp 159. Op amp 159 is configured as a unity gain amplifier for producing a low-impedance source of the voltage produced by voltage divider resistors 155 and 157, of approximately +4.5 volts.

Bandpass filter 38 includes an operational amplifier 148, which may be of the type commercially available under part number TL062CD. The inverting input of op amp 148 is coupled through capacitor 150 to input node 146 for receiving the signal passed by high transient limiter 36. The non-inverting input of op amp 148 is coupled to the aforementioned VR regulated voltage 152. A biasing resistor 154 extends between regulated supply voltage VR 152 and input node 146 to maintain a d.c. bias of +4.5 volts at input node 146. A feedback resistor 156 extends between the output node 158 of op amp 148 and the inverting input thereof. Capacitor 150 is selected to provide the low frequency cutoff characteristics of bandpass filter 38; signals below a first predetermined cutoff frequency are blocked by capacitor 150. A feedback capacitor 160 extends between output node 158 and input node 146. Feedback capacitor 160 is selected to provide the high frequency cutoff characteristics of bandpass filter 38; signals above a second predetermined cutoff frequency are passed by capacitor 160 back to input node 146, but in opposing phase to the original input signal, to attenuate such frequencies.

Output node 158 is selectively coupled through an analog switch 162 to input node 40 of the analog delay line enclosed by dashed lines 44. The function and purpose of analog switch 162 will be described in greater detail below. For purposes of the description of the normal operation of comb filter 42 shown in FIG. 2, it may be assumed that analog switch 162 simply shorts node 158 to input node 40 of the analog delay line. It will be noted that node 158, and hence input node 40, are also coupled to inverting amplifier 48.

Analog delay line 44 includes a bucket brigade device 164 of the type commercially available from Panasonic under part number MN3207. Such bucket brigade device includes 1024 delay stages between input and output. Such bucket brigade devices are also generally available from EG&G Reticon of Sunnyvale, Calif. Specific details as to the structure and operation of such bucket brigade devices may be found in Application Note No. 107, entitled "BUCKET BRIGADE DEVICE, CIRCA 1977" published by EG&G Reticon of Sunnyvale, Calif., the contents of which are hereby incorporated by reference. Bucket brigade device 164 essentially receives the analog voltage present at input node 40 on its input pin 3, passes such voltage in timed sequence to a series of 1024 gated storage capacitors contained in such bucket brigade device, and recreates the same analog voltage, though time-delayed, at its output node 52 formed at the junction of resistors 166 and 168. The opposing end of resistor 166 is coupled to output pin 8 of bucket brigade device 164, and the opposing end of resistor 168 is coupled to output pin 7 of bucket brigade device 164. In addition, resistor 170 extends between output pin 8 of bucket brigade device 164 and ground, while resistor 172 extends between output pin 7 of bucket brigade device 164 and ground.

Analog delay line 44 also includes a bucket brigade driver device 174 of the type commercially available from Panasonic as part number MN3102. Bucket brigade driver device 174 receives a clocking signal on its input pin 7 and generates therefrom clocking signals needed by bucket brigade device 164; such clocking signals are indicated in FIG. 8B by conductors 176, 178, and 180.

The clocking signal supplied to input pin 7 of bucket brigade driver device 174 is received via conductor 182 from the output of clock circuit 46. Clock circuit 46 includes an integrated circuit 184 of type CD4060 commercially available from Signetics. Assuming that the fundamental noise frequency is considered to be 60 Hz., then a crystal 186 which oscillates at a frequency of 3.93216 MegaHertz is coupled across input pins 1 (RS) and 10 (RTC) of integrated circuit 184 to supply a 3.93216 MHz. input signal. The opposing ends of crystal 186 are also each coupled by capacitors 188 and 190 to ground, and a resistor 192 is coupled in parallel with crystal 186. Based upon the 3.93216 MHz. input signal, integrated circuit 184 divides such input signal down by a factor of 64, and provides an output clocking signal at 61.44 KHz. on output pin 4; conductor 182 then relays such 61.44 KHz. clocking signal to the clock input of bucket brigade driver device 174. The application of 61.44 KHz. clocking signals to a 1,024 stage bucket brigade device results in an overall time delay of 61,440 Hz./1,024, or 60 Hz. Note that if the fundamental noise frequency were 50 Hz. instead of 60 Hz., as would apply to the European market, for example, then crystal 186 would be replaced by a crystal oscillating at 3.2768 MHz.; otherwise, the circuitry remains the same.

As indicated above, output node 158 of bandpass filter 38 is also coupled to the input of inverting amplifier 48. Inverting amplifier 48 includes an operational amplifier 194 of the type commercially available as part number TL062CD. The inverting input terminal (pin 2) of op amp 194 is coupled through input resistor 196 to node 158 to receive the signal passed by bandpass filter 38. The non-inverting input terminal (pin 3) of op amp 194 is coupled to the regulated +4.5 voltage supply 152 (VR). A feedback resistor 198, equal in value to input resistor 196, is coupled between the output terminal (pin 1) of op amp 194 and the inverting input terminal (pin 2) of op amp 194. Accordingly, inverting amplifier 48 has a gain of unity and simply inverts the input signal received from bandpass filter 38.

As indicated above with respect to FIG. 2, the output signals generated by analog-delay line 44 and inverting amplifier 48 are added together by a summing circuit 50. The output signal developed at node 52 by analog delay line 44 is coupled by resistor 200 to summing node 56. Likewise, the output signal developed by inverting amplifier 48 is coupled by parallel resistors 202 and 204 to summing node 56. Resistor 202 is shown as a variable resistor for allowing some adjustment of the value of such resistor; this permits the effective output impedance of the inverting amplifier 48 to be matched with the output impedance of analog delay line 44 (which is determined primarily by resistor 200), thereby ensuring that nulling of 60 Hz. signals is maximized. Summing node 56 of passive summer circuit 50 passively sums together the output signals generated by the analog delay line and the inverting amplifier, in the general manner previously described relative to FIGS. 3–5.

Output summing node 56 is coupled to the input of gain stage 58, which includes an operational amplifier 206 that may be of the type commercially available under part number TL061CD. Non-inverting input terminal (pin 3) is coupled to summing node 56 for receiving the summed signal. Capacitor 208 extends from summing node 56 to ground and filters out any a.c. components having a frequency above 12 KHz. The output terminal (pin 6) of op amp 206 is coupled by feedback resistor 210 to the inverting input terminal (pin 2) of op amp 206 to provide negative feedback for unity gain. A capacitor 212 is also connected in parallel with feedback resistor 212 for the purpose of controlling frequency response. When a butt set is not connected to the inductive amplifier, then the inverting input terminal of op amp 206 is also connected through resistor 214 and through capacitor 216 to the regulated voltage +4.5 volts (VR) 152 via analog switch 218; the purpose of analog switch 218 will be explained in greater detail below. Under such circumstances, gain stage 58 provides a signal gain of approximately ten.

The output of gain stage 58 is coupled by series-connected resistors 220 and 222 to node 228 of low pass filter stage 60. A capacitor 224 extends from the series connection node 226 of resistors 220 and 222 to ground. Low pass filter 60 includes an op amp 230 which may be of the type commercially available under part number TL062CD. Inverting input terminal (pin 6) of op amp 230 is coupled to input node 228 through resistor 232. The non-inverting input terminal (pin 5) of op amp 230 is connected to the +4.5 volt regulated voltage 152 (VR). The output terminal (pin 7) of op amp 230 is coupled by feedback resistor 234 to input node 228 to provide negative feedback thereto. In addition, feedback capacitor 236 is coupled from output terminal (pin 7) of op amp 230 to inverting input terminal (pin 6) of op amp 230; the value of capacitor 236 is selected to attenuate any signal components having frequencies above 5 KHz.

The output of low pass filter 60 is coupled by conductor 238 and series capacitor 242 to the input of speaker driver stage 62. Speaker driver stage 62 includes an audio power amplifier 240 of the type commercially available under part number LM386; capacitor 242 couples the input signal to input terminal (pin 3) of amplifier 240. The output terminal (pin 5) of amplifier 240 is coupled to ground through an R-C network including capacitor 244 and 246. In addition, the output terminal of amplifier 240 is coupled through series-connected capacitors 248 and 250 to a first built-in speaker terminal 252; the second built-in speaker terminal 254 is selectively coupled to ground through manual switch SW1 258. The built-in speaker is not shown in FIG. 8C, but would be connected between speaker terminals 252 and 254. Manual switch SW1 258 is depressed by the user to activate the built in speaker. The leads of a butt set may also be connected to butt set connector terminals 272 and 274 to activate the inductive amplifier; capacitor 273 couples the second speaker terminal 254 to butt set connector terminal 272; butt set connector terminal 274 is coupled to ground.

Also indicated in FIG. 8C are a gain control circuit block 260, to be described in greater detail below, and an auto-on circuit block 266. Within auto-on circuit block 266, a +9 volt supply battery is coupled to battery terminals 268 and 270. Auto-on circuit also provides the filtered +9 volt supply 104. Auto-on circuit block 266 serves to limit battery drain to those periods when either the user depresses the manual switch SW1 258, or the user connects the leads of a telephone butt set, or a shorting wire, across butt set connection terminals 272 and 274. If switch SW1 258 is depressed, a bias current is conducted by resistor 262 and diode 264 for triggering auto-on circuit 266; likewise, if the leads of a butt set, or a shorting wire, are connected across butt set terminals 272 and 274, a bias current is drawn by resistor 276 and diode 278 for triggering auto-on circuit 266. Details of the operation of auto-on circuit block can be found in U.S. Pat. No. 5,457,441 issued to Clement, and assigned to the assignee of the present invention; the description set forth in such prior application is hereby incorporated by reference.

There are some instances wherein both of the tones emitted by a given tone generator happen to fall within null points of the comb filter. In this event, the comb filter would null out both such tones, and neither tone would be heard by the user through the inductive amplifier. Accordingly, the comb filter can be bypassed in such instances. In FIG. 8B, switch SW2 designated by reference numeral 280 is a two-position slide switch having three terminals 282, 284, and 286. The first terminal 282 is grounded. The second terminal 284 is connected by pull-up resistor 288 to the +9 volt filtered supply 104. The third terminal is left open as a high impedance.

In its first position, slide switch 280 shorts together the first terminal 282 with the second terminal 284, thereby shorting second terminal 284 to ground. In its second position, slide switch 280 shorts together second terminal 284 with the open third terminal 286, allowing pull-up resistor 288 to pull second terminal 284 up toward +9 volts.

Second terminal 284 of switch 280 is also coupled to the enable control inputs of analog switches 162 and 290, both of which may be provided by an integrated circuit of the type commercially available under part number CD4066. Assuming for the moment that slide switch 180 is in its second position, then terminal 284 is high, thereby enabling analog switches 162 and 290. Accordingly, analog switch 162 permits the output of bandpass filter 38 to pass unimpeded from its input terminal (pin 4) to its output terminal (pin 3) to input node 40. The input terminal (pin 11) of analog switch 290 is grounded, and the output terminal (pin 10) of analog switch 290 is connected by a pull-up resistor 292 to the +9 volt filtered supply 104. Thus, analog switch 290 is enabled and shorts its output terminal (pin 10) to ground. The output terminal (pin 10) of analog switch 290 is coupled to the enable control input of a further analog switch 294. The input terminal (pin 1) of analog switch 294 is coupled to the regulated +4.5 voltage 152 (VR), and the output terminal (pin 2) of analog switch 294 is coupled to input node 40. However, since the enable control input of analog switch 290 is currently low, or ground, analog switch 294 is disabled, and regulated voltage VR is not connected to input node 40. Thus, with slide switch 280 in its second position, the comb filter is allowed to operate normally.

However, to disable the comb filter, the user merely slides slide switch 280 to its first position; this causes analog switch 162 to be disabled, and allows analog switch 294 to be enabled, thereby forcing input node 40 to the regulated +4.5 volt voltage VR. Accordingly, slide switch 280, along with analog switches 162, 290 and 294 function as a single-pole, double-throw switch. With slide switch 280 in its first position, analog delay line 44 merely provides a continuous +4.5 volts at its output node 52. Note, however, that the operation of slide switch 280 does not affect inverting amplifier 48, which still receives the signal output by bandpass filter 38.

In the absence of any detected signal, the d.c. voltage at the output terminal 158 of bandpass filter 38 is regulated voltage 152 (VR) because such voltage is directly applied to the non-inverting input terminal of op amp 148 within bandpass filter 38. As noted above, the voltage at terminal 158 is applied to the inverting terminal of op amp 194 in inverting amplifier 48 via resistor 196. Since the d.c. voltage of terminal 158 is equal to VR, and since VR is also applied to the non-inverting input terminal of op amp 194 within inverting amplifier 194, then the steady state d.c. voltages at both the inverting input terminal (pin 2) and the output terminal (pin 1) of op amp 194 also assume voltage VR. Accordingly, viewed from summing node 56, the analog delay line sources voltage VR through resistor 200 and the inverting amplifier 48 sources d.c. voltage VR through the matched resistor formed by resistors 202 and 204. Therefore, when the comb filter is disabled, i.e., when slide switch 280 is in its first position, summing node 56 is at a d.c. potential of regulated voltage VR; any a.c. signal component passed by bandpass filter 38 and inverting amplifier 48 is merely summed with the d.c. steady state regulated voltage VR. Thus, the summing node 56 merely provides a non-time delayed, inverted phase version of the detected input signal, without any nulling of 60 Hz. signal components.

As indicated above, the present invention includes an automatic gain control feature to reduce the gain when butt set leads are connected to the butt set terminals 272 and 274. Reduction of the gain is appropriate under such circumstances for two reasons. First, the speaker is being held close to the user's ear, and excessive volume could be annoying to the user. Secondly, butt set leads are typically six foot lengths of unshielded wire, and the connection of such butt set leads can introduce noise into the circuit as may cause oscillation and instability.

Assuming that a butt set is not connected to butt set terminals 272 and 274, then resistor 276 and diode 278 do not conduct any current, and have no effect on the voltage at node 296. Accordingly, if the user then depresses switch SW1 (258) to activate the built-in speaker, PNP transistor 300 will become forward biased, the collector voltage developed across resistor 302 will rise, and the voltage on conductor 304 will be a logic high level. Conductor 304 is coupled to the enable control input (pin 5) of analog switch 218, thereby coupling regulated voltage VR 152 from input terminal (pin 8) to output terminal (pin 9). As explained above, under such circumstances, op amp 206 and gain stage 58 provide a gain of approximately ten.

However, if the leads of a butt set are now connected across butt set terminals 272 and 274, then current flows through resistor 298, through diode 278, and through resistor 276. As the value of resistor 276 is small by comparison to the value of resistor 298, the voltage at node 296 falls, and diode 264 is back-biased. Provided that the user does not depress switch 258 (SW1), then PNP transistor 300 does not have any base biasing current, and remains non-conductive. Accordingly, no voltage is developed across resistor 302, and conductor 304 remains at a logic low level. Analog switch 218 is therefore disabled, and capacitor 216 is therefore coupled to a high impedance. The gain of op amp 206 within gain stage 58 falls back to unity gain, thereby decreasing the gain of the inductive amplifier by a factor of 10 when the butt set leads are connected. This gain control feature reduces the likelihood that the attachment of the butt set leads will induce oscillations or instability in the inductive amplifier.

Suggested values for the components shown in FIGS. 8A, 8B, and 8C are set forth below:

| Reference numeral | Value |
| --- | --- |
| resistor 100 | 1M ohm |
| transistor 102 | MPF102, N-channel, J-FET |
| capacitor 103 | 100 uF |
| capacitor 105 | .1 uF |
| resistor 106 | 15M ohm |
| resistor 108 | 1M ohm |
| resistor 110 | 22K ohm |
| resistor 112 | 68K ohm |
| capacitor 16 | .001 uF |
| resistor 120 | 1K ohm |
| resistor 122 | 10 ohm |
| capacitor 126 | (selected at test) |
| capacitor 128 | .1 uF |
| diode 134 | 1N5818 Schottky |
| diode 136 | 1N5818 Schottky |
| diode 138 | 1N5818 Schottky |
| diode 140 | 1N5818 Schottky |
| capacitor 142 | .1 uF |
| resistor 144 | 120K ohm |
| capacitor 150 | .001 uF |
| resistor 154 | 240K ohm |
| resistor 155 | 100K ohm |
| resistor 156 | 120K ohm |
| resistor 157 | 100K ohm |
| capacitor 160 | .001 uF |
| capacitor 161 | 1 uF |
| resistor 166 | 5.6K ohm |
| resistor 168 | 5.6K ohm |
| resistor 170 | 100K ohm |
| resistor 172 | 100K ohm |
| capacitor 185 | .1 uF |
| resistor 187 | 100 ohm |
| capacitor 188 | 33 pF |
| capacitor 190 | 33 pF |
| resistor 192 | 1M ohm |
| resistor 196 | 10K ohm |
| resistor 198 | 10K ohm |
| resistor 200 | 47K ohm |
| resistor 202 | 100K ohm variable |
| resistor 204 | (selected at test) |
| capacitor 208 | .001 uF |
| resistor 210 | 100K ohm |
| capacitor 212 | (selected at test) |
| resistor 214 | 10K ohm |
| capacitor 216 | 1 uF |
| resistor 220 | 56K ohm |
| resistor 222 | 56K ohm |
| capacitor 224 | 3300 pF |
| capacitor 225 | 3300 pF |
| resistor 232 | 33K ohm |
| resistor 234 | 120K ohm |
| capacitor 236 | 220 pF |
| capacitor 242 | .015 uF |
| capacitor 244 | .1 uF |
| resistor 246 | 10 ohm |
| capacitor 248 | 100 uF |
| capacitor 250 | 100 uF |
| resistor 262 | 10K ohm |
| diode 264 | 1N4148 |
| capacitor 273 | .047 uF |
| resistor 276 | 10K ohm |
| diode 278 | 1N4148 |
| capacitor 267 | 100 uF |
| resistor 269 | 10 ohm |
| resistor 271 | 10 ohm |
| capacitor 273 | 100 uF |
| capacitor 275 | 100 uF |
| transistor 277 | TP2502N8, P-channel |
| capacitor 279 | 1 uF |
| resistor 298 | 100K ohm |
| resistor 302 | 100K ohm |
| capacitor 303 | 1 uF |
| resistor 305 | 10K ohm |

-continued

| Reference numeral | Value |
| --- | --- |
| diode 307 | 1N4148 |
| transistor 300 | 3906 |
| resistor 315 | 100 ohm |

Those skilled in the art will now appreciate that an inductive amplifier has been described which is adapted to amplify tone signals provided by a conventional tone generator, which allows the amplified tone to be heard via an internal speaker or through the earpiece of a butt set, and which automatically reduces the gain of the inductive amplifier when the leads of the butt set are interconnected therewith. While the present invention has been described with respect to a preferred embodiment thereof, such description is for illustrative purposes only, and is not to be construed as limiting the scope of the invention. Various other modifications and changes may be made to the described embodiments by those skilled in the art without departing from the true spirit and scope of the invention as defined by the appended claims.

I claim:

1. An inductive amplifier for detecting and amplifying an electrical tone conducted by one of a group of wires in order to identify and trace a particular wire, said inductive amplifier comprising in combination:

a. a housing;
   b. an electrically conductive probe extending from the housing for being placed adjacent a wire under test to detect an electrical tone signal therein;
   c. a variable gain amplifier contained within the housing to amplify the detected electrical tone signal, the variable gain amplifier selectively providing a first level of gain or a second level of gain;
   d. a speaker disposed in the housing for reproducing the amplified electrical tone as an audible signal;
   e. butt set terminals extending from the housing and adapted to be coupled with leads of a telecommunications butt set for allowing a speaker within an earpiece of the telecommunications butt set to reproduce the amplified electrical tone as an audible signal; and
   f. a butt set lead detection circuit for detecting that the leads of the butt set are connected to the butt set terminals, and for causing the gain of the variable gain amplifier to decrease from the first level of gain to the second level of gain when the leads of the butt set are connected to the butt set terminals.

2. An inductive amplifier as recited by claim 1 wherein the variable gain amplifier includes an operational amplifier having a non-inverting input terminal, an inverting input terminal, an output terminal, a feedback resistor coupled between the output terminal and the inverting input terminal, a gain control resistor having a first end coupled to the inverting input terminal of the operational amplifier, and an electronic switch coupled between a second end of the gain control resistor and a d.c. bias potential, the electronic switch selectively coupling the second end of the gain control resistor to the d.c. bias potential when the butt set leads are not connected to the butt set terminals for allowing the variable gain amplifier to provide the first level of gain, the electronic switch selectively uncoupling the second end of the gain control resistor from the d.c. bias potential when the butt set leads are connected to the butt set terminals for causing the gain of the variable gain amplifier to decrease to the second level of gain.

\* \* \* \* \*